United States Patent
Yang et al.

(10) Patent No.: US 8,659,128 B2
(45) Date of Patent: Feb. 25, 2014

(54) FLIP CHIP PACKAGE STRUCTURE WITH HEAT DISSIPATION ENHANCEMENT AND ITS APPLICATION

(75) Inventors: Yu-Lin Yang, Xiyu Township, Penghu County (TW); Lih-Ming Doong, Zhunan Township, Miaoli County (TW)

(73) Assignee: Richtek Technology Corp., Hsinchu (TW)

( * ) Notice: Subject to any disclaimer, the term of this patent is extended or adjusted under 35 U.S.C. 154(b) by 6 days.

(21) Appl. No.: 13/043,782

(22) Filed: Mar. 9, 2011

(65) Prior Publication Data
US 2011/0221047 A1    Sep. 15, 2011

(30) Foreign Application Priority Data
Mar. 12, 2010   (TW) .............................. 99107271 A

(51) Int. Cl.
*H01L 23/495*   (2006.01)
(52) U.S. Cl.
USPC ................... 257/666; 257/690; 257/E23.128

(58) Field of Classification Search
USPC .................... 257/666, 690, E23.128
See application file for complete search history.

(56) References Cited

U.S. PATENT DOCUMENTS

| | | | |
|---|---|---|---|
| 6,657,311 B1 | 12/2003 | Hortaleza et al. | |
| 8,072,082 B2 * | 12/2011 | Yean et al. | 257/777 |
| 2009/0267171 A1 * | 10/2009 | Yean et al. | 257/434 |
| 2010/0099226 A1 | 4/2010 | Sasagawa et al. | |

FOREIGN PATENT DOCUMENTS

TW    201001562 A1    1/2010

* cited by examiner

*Primary Examiner* — Howard Weiss
*Assistant Examiner* — Steven Rao
(74) *Attorney, Agent, or Firm* — Muncy, Geissler, Olds & Lowe, P.C.

(57) ABSTRACT

A flip chip package structure includes a chip placed under a lead frame, a bump on the upper surface of the chip that is electrically connected to the lead of the lead frame, and a backside metal on the lower surface of the chip that is exposed outside an encapsulant encapsulating the chip and a portion of the lead frame.

4 Claims, 4 Drawing Sheets

FLIP CHIP PACKAGE STRUCTURE WITH HEAT DISSIPATION ENHANCEMENT AND ITS APPLICATION

FIELD OF THE INVENTION

The present invention is related generally to a flip chip package structure and, more particularly, to a flip chip package structure with heat dissipation enhancement and its application.

BACKGROUND OF THE INVENTION

The flip chip package is one of the chip package techniques. As compared with the traditional chip packages where the chip is attached to a pad and then wire bonded to the electrical connection pads on a substrate, the flip chip package is distinguished by growing bumps from the electrical connection pads on the chip and then flipping the chip over to be bonded to the electrical connection pads on a substrate with the bumps. The flip chip package contributes to effective heat dissipation while ensuring low signal interference, good electrical properties and minimum connection circuit loss. In fine pitch applications, high frequency or high input/output (I/O) pin count, benefits of the flip chip package can be fully demonstrated.

The future trend for electronic products is toward compactness, high speed and high pin count while the traditional lead frame based package is not applicable and will be limited to low-end/low-cost products. The development of the flip chip package will remain in pursuing applications of high pin count and fine pitch. Hence, there is a need of a flip chip package structure with heat dissipation enhancement.

SUMMARY OF THE INVENTION

An objective of the present invention is to provide a flip chip package structure with heat dissipation enhancement.

According to the present invention, a flip chip package structure with heat dissipation enhancement includes a lead frame having a lead, a chip having an upper surface formed with a bump thereon that is electrically connected to the lead and a lower surface provided with a backside metal for heat dissipation, and an encapsulant encapsulating the chip and the lead frame but leaving the backside metal exposed outside.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
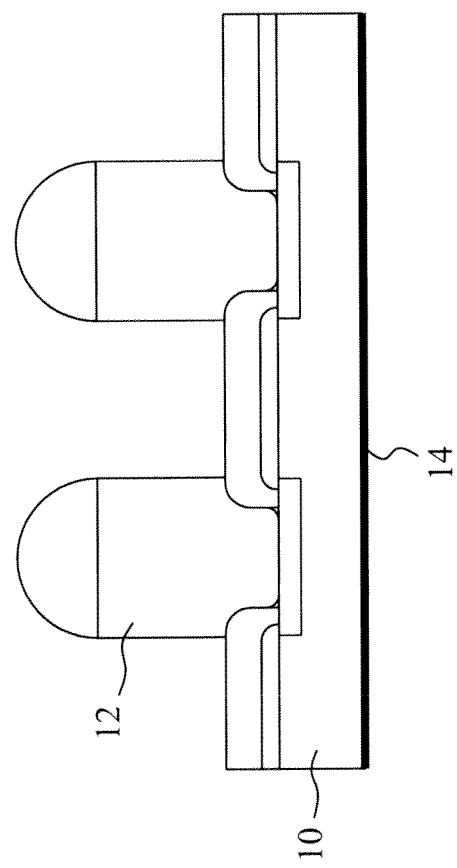
FIG. 1 shows a chip structure used in a flip chip package structure according to the present invention.

FIG. 1 shows a chip structure used in a flip chip package structure according to the present invention, in which the upper surface of a chip 10 has bumps 12 at electrical connections to be bonded to an external circuit, and the lower surface of the chip 10 has a backside metal 14 attached thereto for transferring heat outward from the chip 10.

Figure 2:
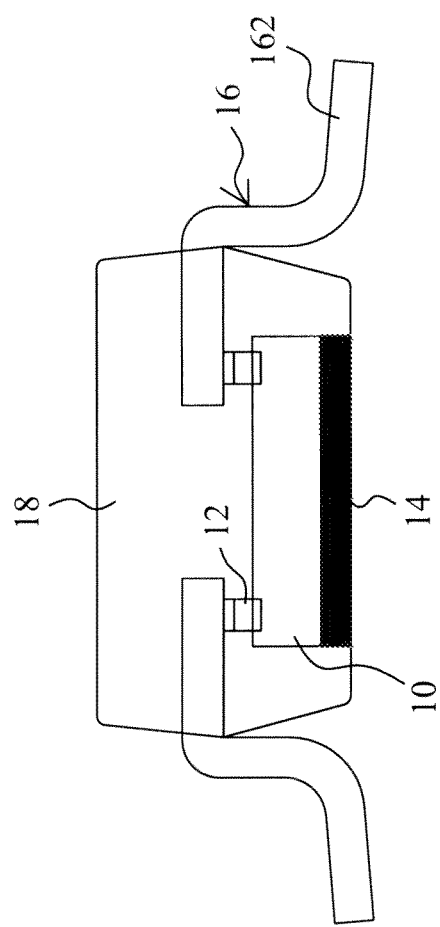
FIG. 2 is a first embodiment according to the present invention.

FIG. 2 is a first embodiment according to the present invention, which includes a lead frame 16 having leads 162, and an encapsulant 18 encapsulating the bumps 12, a portion of the chip 10, and a portion of the lead frame 16. In this package structure, the chip 10, rather than flipped over as required by the conventional flip chip package structures, is directly placed under the lead frame 16 for electrical connections between the leads 162 and the bumps 12, yet the resultant structure possesses the advantages of low signal interference, good electrical properties, minimum connection circuit loss and effective heat dissipation as those provided by the conventional flip chip package structures. The backside metal 14 is exposed outside the encapsulant 18 for the chip 10 to dissipate heat to the ambient environment directly, thereby improving heat dissipation. In this embodiment, the leads 162 of the lead frame 16 are partially covered by the encapsulant 18 with the remained part as outer leads.

Figure 3:
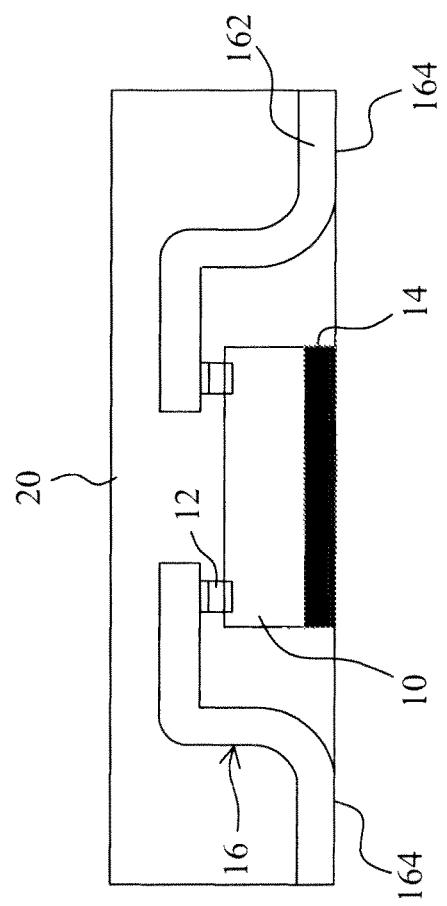
FIG. 3 is a second embodiment according to the present invention.

FIG. 3 is a second embodiment according to the present invention. Similar to that of FIG. 2, the chip 10 is placed under the lead frame 16 so as for the electrical connections between the leads 162 and the bumps 12, and the backside metal 14 is exposed outside an encapsulant 20 for heat dissipation enhancement. Different from that of FIG. 2, however, the lead frame 16 in this embodiment is fully encapsulated by the encapsulant 20 so that there are no outer leads extended outside the encapsulant 20 but only partial lower surfaces 164 of the leads 162 are exposed.

Figure 4:
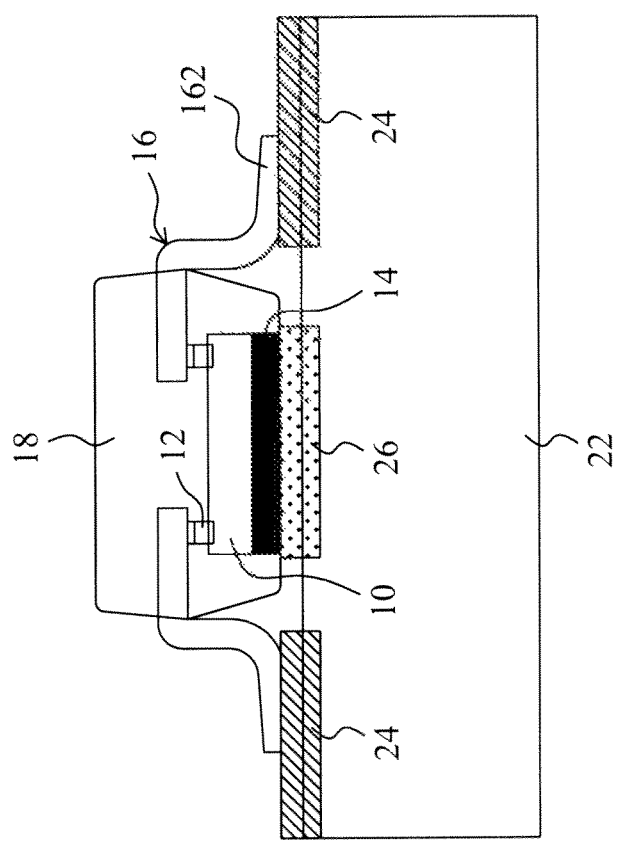
FIG. 4 shows an application of the flip chip package structure of FIG. 2.

FIG. 4 shows an application of the flip chip package structure of FIG. 2 that is placed on a circuit board 22, and has the chip 10 electrically connected to metal 24 of the circuit board 22 through the bumps 12 and the leads 162, and the backside metal 14 in thermal contact with a thermally conductive material 26 on the circuit board 22. The backside metal 14 may be soldered to the thermally conductive material 26; or, alternatively, applied with a thermally conductive adhesive between the backside metal 14 and the thermally conductive material 26. Heat generated by the working chip 10 is transferred to the thermally conductive material 26 through the backside metal 14, so as to maintain the chip 10 working under a stable temperature condition. In other embodiments, the thermally conductive material 26 on the circuit board 22 is a portion of the same metal layer from which is made the metal 24 on the circuit board 22.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A flip chip package structure with heat dissipation enhancement, comprising:
   a lead frame having a lead;
   a chip having a bump on an upper surface thereof and a backside metal on a lower surface thereof, placed under the lead frame with the bump electrically connected to the lead; and
   an encapsulant encapsulating the chip and the lead frame but exposing the backside metal to be in contact with a thermally conductive material on an external circuit board,
   where the backside metal is exposed outside the encapsulant.

2. The flip chip package structure of claim 1, wherein the encapsulant encapsulates only a portion of the chip, the bump, only a portion of the lead frame to expose a portion of the lead.

3. The flip chip package structure of claim 2, wherein the exposed portion of the lead is a lower surface of the lead.

4. An application of the flip chip package structure of claim 1, comprising a circuit board having a metal electrically connected to the lead and a thermally conductive material in thermal contact with the backside metal.

\* \* \* \* \*